US008223052B1

(12) United States Patent
Kong et al.

(10) Patent No.: US 8,223,052 B1
(45) Date of Patent: Jul. 17, 2012

(54) RANDOMIZED TIME ENCODING MACHINE FOR SUB-NYQUIST SIGNAL SAMPLING

(75) Inventors: Cathy (Xiangming) Kong, Thousand Oaks, CA (US); Peter Petre, Oak Park, CA (US); Roy M. Matic, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 66 days.

(21) Appl. No.: 12/818,993

(22) Filed: Jun. 18, 2010

(51) Int. Cl.
    *H03M 3/00* (2006.01)
(52) U.S. Cl. ................. 341/143; 341/155
(58) Field of Classification Search .......... 341/143, 341/155
    See application file for complete search history.

(56) References Cited

U.S. PATENT DOCUMENTS

| 6,087,968 | A  * | 7/2000  | Roza ........................ 341/143 |
| 7,403,144 | B1 * | 7/2008  | Cruz-Albrecht et al. ..... 341/143 |
| 7,515,084 | B1   | 4/2009  | Cruz-Albrecht et al. ..... 341/157 |
| 7,573,956 | B2 * | 8/2009  | Lazar et al. ................. 375/340 |
| 7,847,716 | B2 * | 12/2010 | Rivoir ........................ 341/143 |

OTHER PUBLICATIONS

U.S. Appl. No. 12/262,691, filed Oct. 31, 2008, Petre.
David L. Donoho, "Compressed Sensing", IEEE Trans. on Information Theory, vol. 52, No. 4, pp. 1289-1306, Apr. 2006.
E. Candes and T. Tao, "Decoding by linear programming", IEEE Trans. Information Theory, vol. 51, 2005, pp. 4203-4215. Dec. 2005.
E. Candes and T. Tao, "Near Optimal Signal Recovery from Random Projections: University Encoding Strategies?", IEEE Trans. on Information Theory, vol. 52, No. 12, pp. 5406-5425, Dec. 2006.
Aurel A. Lazar and LászlóT. Tóth, "Perfect Recovery and Sensitivity Analysis of Time Encoded Bandlimited Signals", IEEE Trans. on Circuits and Systems-I: Regular Papers, vol. 51, No. 10, Oct. 2004, pp. 2060-2073.

* cited by examiner

*Primary Examiner* — Khai M Nguyen
(74) *Attorney, Agent, or Firm* — Ladas & Parry

(57) ABSTRACT

A time encoding machine (TEM) for time encoding an input signal includes a hysteresis quantizer having a time encoded sequence output and a random sequence generator having a random signal output coupled to the hysteresis quantizer for randomizing switching times of the hysteresis quantizer.

24 Claims, 9 Drawing Sheets

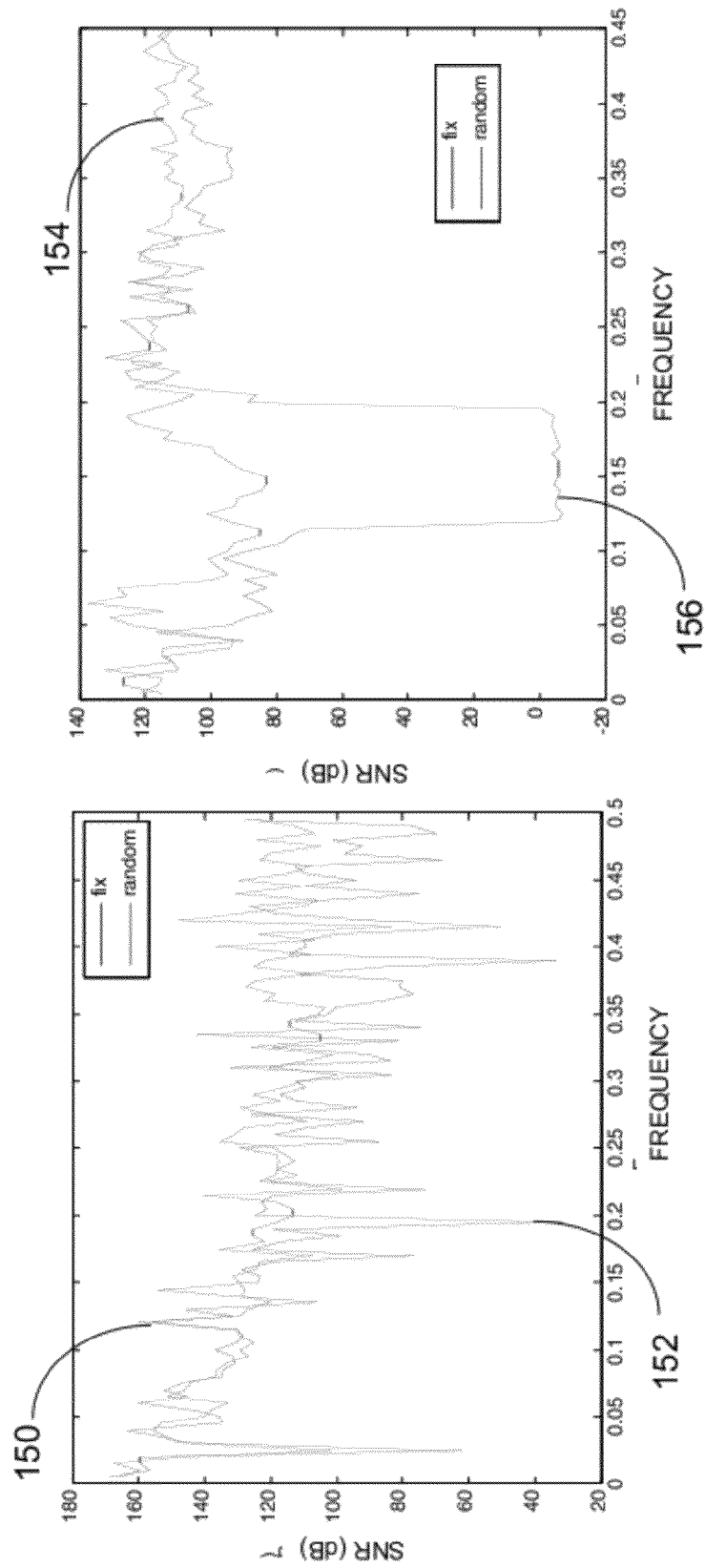

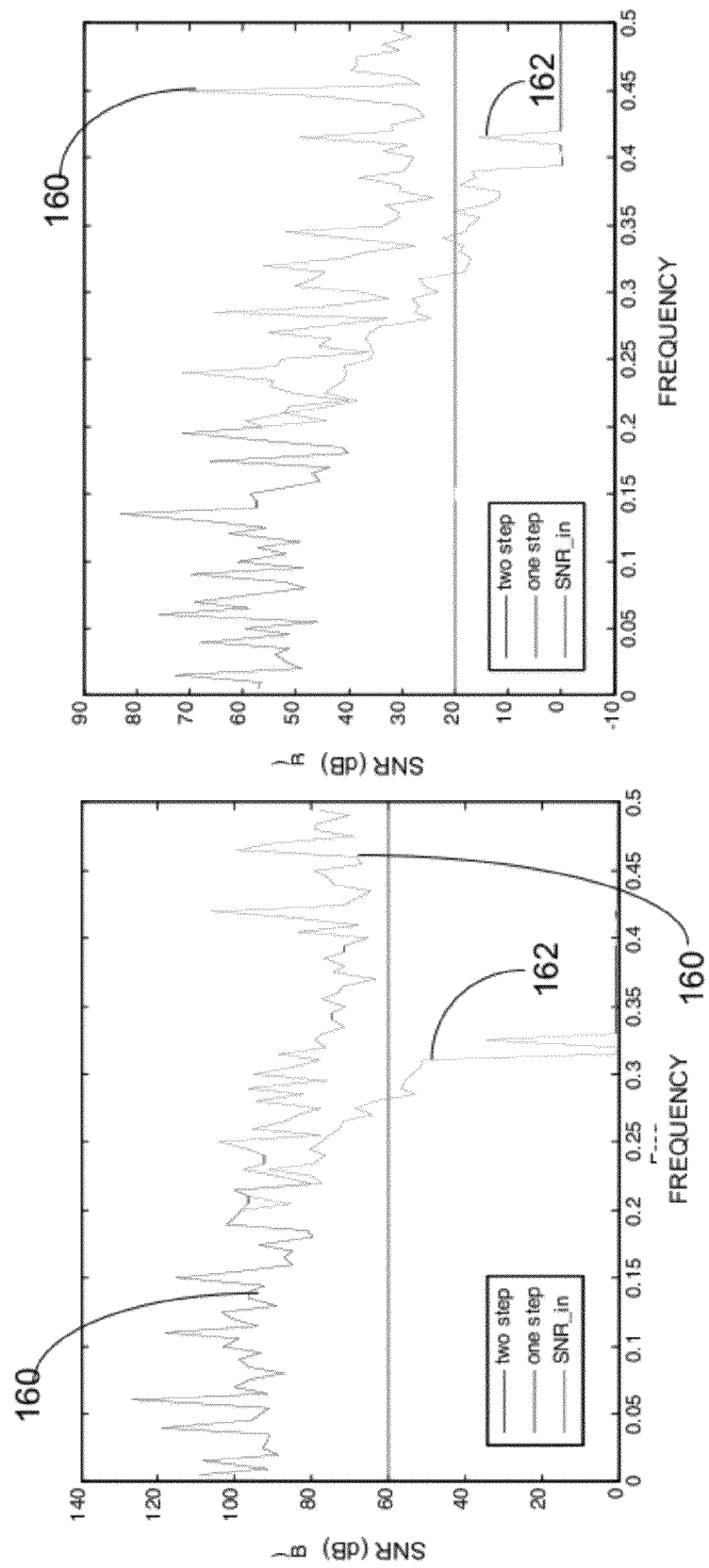

US 8,223,052 B1

RANDOMIZED TIME ENCODING MACHINE FOR SUB-NYQUIST SIGNAL SAMPLING

STATEMENT REGARDING FEDERALLY SPONSORED RESEARCH OR DEVELOPMENT

The present invention was made with support from the United States Government under Contract No. N00014-09-C-0234 awarded by DARPA. The U.S. Government has certain rights in the invention.

TECHNICAL FIELD

This disclosure relates to compressive sensing and in particular to time encoders (TE) used for time-encoded-based compressive sensing (TE-CS).

BACKGROUND

Compressive sensing is an approach to sensing signals that enables sampling signals at below the Nyquist rate. With compressive sampling, it is possible to reconstruct a sampled signal perfectly, even though the signal is sampled at below the Nyquist rate. One approach to compressive sensing is to create a time encoded representation of a signal. This is done by first converting an analog signal that has a continuous voltage range to a binary amplitude signal. Then the zero crossing time points are used to form a time encoded signal representation.

Time-encoded-based compressive sensing (TE-CS) system has been used in the prior art. Examples of time encoders for compressive sensing are to be found in U.S. Ser. No. 12/262,691, "Compressed Sensing Time Encoded Based Analog-to-Digital Converter", filed Oct. 31, 2008 by P. Petre and J. Cruz-Albrecht, U.S. Pat. No. 7,403,144 "Pulse Domain Encoders and Filter Circuits" to J. Cruz-Albrecht and P. Petre, and U.S. Pat. No. 7,515,084 "Analog-to-Digital Converter using Asynchronous Pulse Technology" to J. Cruz-Albrecht, P. Petre and J. Jensen.

Other prior art references that discuss compressive sensing and/or time encoding include: David L. Donoho, "Compressed Sensing", IEEE Trans. on Information Theory, Vol. 52, No. 4, pp. 1289-1306, April 2006; E. Candes and T. Tao, "Decoding by linear programming", IEEE Trans. Information Theory, Vol. 51, 2005, pp 4203-4215; E. Candes and T. Tao, "Near Optimal Signal Recovery from Random Projections: University Encoding Strategies?", IEEE Trans. on Information Theory, Vol. 52, No. 12, pp. 5406-5425, December 2006; and Aurel A. Lazar and László T. Tóth, "Perfect Recovery and Sensitivity Analysis of Time Encoded Bandlimited Signals", IEEE Trans. on Circuits and Systems-I: Regular Papers, Vol. 51, No. 10, October 2004, pp. 2060-2073.

Time encoding is desirable because the performance of current analog to digital converters (ADCs) is not adequate for direct digitization of wide bandwidth and high dynamic range RF signals. For example, a 10 GHz bandwidth state-of-the-art ADC can provide only 5-bit resolution. To accomplish the goal of overcoming the limitation of the current ADCs, one technique called Analog Pulse Processing (APP) or Time Encoding Machine (TEM) represents a continuous analog signal with an asynchronous time-sequence with known binary amplitude. The asynchronous system overcomes many limitations found with synchronous ADCs. Hence it can successfully encode the signal with high bandwidth.

In general, a signal can be perfectly reconstructed from time sequences if the Nyquist rate is satisfied, i.e., if the number of time points within a period is larger than the Shannon number. Moreover, if the signal is sparse in a certain domain, according to compressive sensing theory, the signal can still be fully reconstructed with high probability even if the number of time points is less than the Shannon number. Combining TEM and compressive sensing can enable sampling and reconstructing RF signals of wide bandwidth and high dynamic range.

However, in prior art time encoding machines (TEMs) the measurements may not be "random" enough to comply with compressive sensing theory, which results in an inability to properly reconstruct a sampled signal. In particular, a sampled signal may not be properly reconstructed using compressive sensing in these prior art time encoding implementations, because these prior time encoding processes are signal dependent and the time encoded signal may not be "random" enough for compressive sensing theory to apply.

What is needed is a time encoding machine that can be used successfully for compressive sensing even if the signal is not "random" enough. Also needed are improved methods of reconstructing a sampled signal. The embodiments of the present disclosure answer these and other needs.

SUMMARY

In a first embodiment disclosed herein, a time encoding machine (TEM) for time encoding an input signal comprises a hysteresis quantizer having a time encoded sequence output and a random sequence generator having a random signal output coupled to the hysteresis quantizer for randomizing switching times of the hysteresis quantizer.

In another embodiment disclosed herein, a method for forming a reconstructed signal of an input signal comprises forming a diagonal matrix S as an inverse of a column norm of a first measurement matrix $A\Psi$, so that $[S]=1 / \sqrt{[(A\Psi)^T(A\Psi)]_{i,i}}$; forming a second measurement matrix $A\Psi S$; using the second measurement matrix to form $x_1 = S^{-1}x$; and forming the reconstructed signal x from $x_1$ and the diagonal matrix so that $x = Sx_1$.

In yet another embodiment disclosed herein, a method for time encoded compressive sensing comprises randomizing a switching point of a quantizer for time encoding an input signal to form a randomized time encoded sequence output, and using a two-step process to reconstruct the input signal from the time encoded sequence output.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 6 shows the output SNR in reconstructing a single tone without noise for two different cases: without randomization in accordance with the prior art and with randomization in accordance with the present disclosure;

FIG. 7 shows the output SNR in reconstructing a signal of multiple tones without noise for two different cases: without randomization in accordance with the prior art and with randomization in accordance with the present disclosure;

FIG. 8A shows the output SNR in reconstructing a single tone signal for an input SNR of 60 dB for a one step and a two step time encoding machine in accordance with the present disclosure; and FIG. 8B shows the output SNR in reconstructing a single tone signal for an input SNR of 20 dB for a one step and a two step time encoding machine in accordance with the present disclosure.

DETAILED DESCRIPTION

Figure 1A:
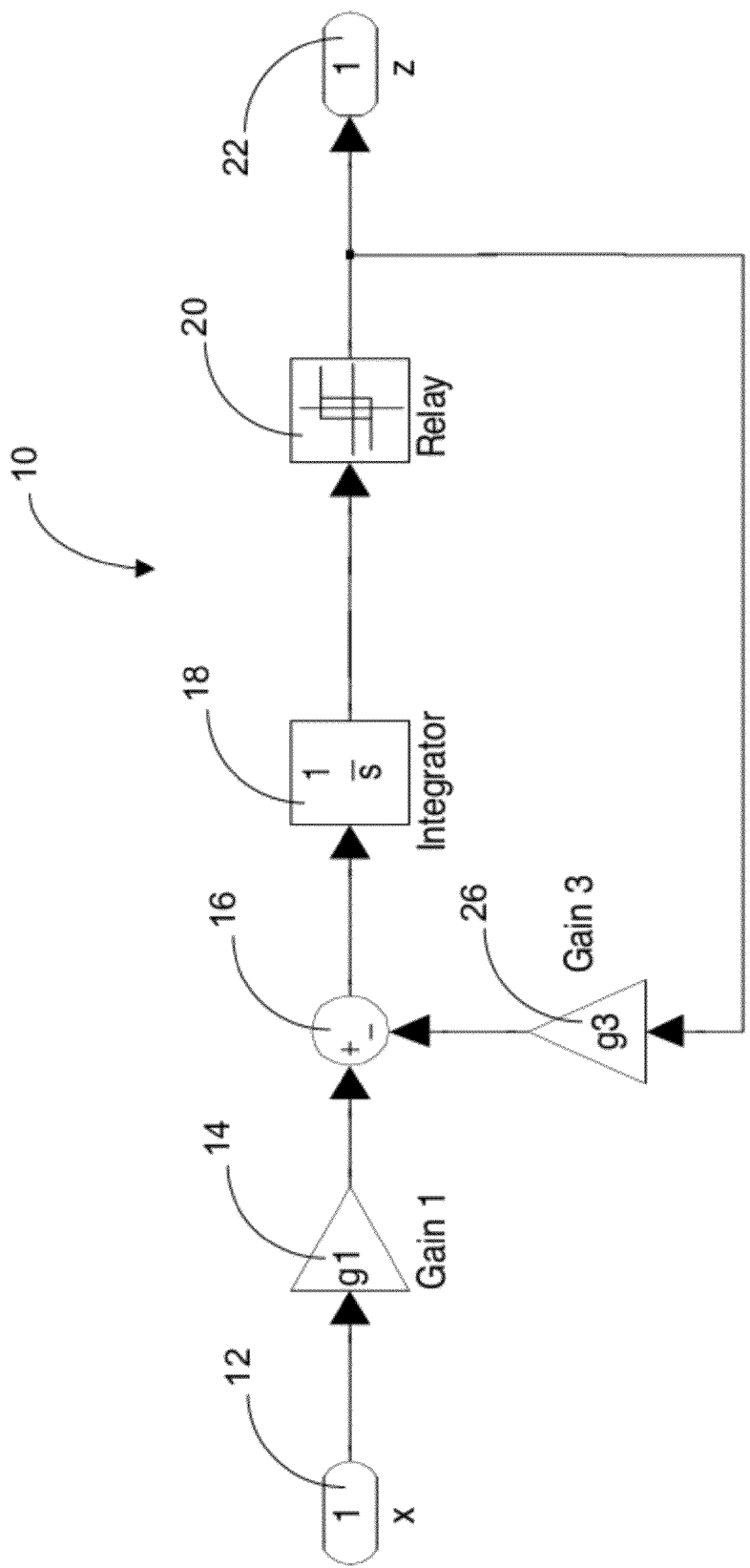
FIG. 1A shows a first-order time encoding machine for encoding amplitude information into a time sequence in accordance with the prior art.

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

The basis for compressive sensing basis is as follows. Let $x(t) \in \Omega$ be a bandlimited signal with bandwidth B. To fully reconstruct the signal from discrete samples, the signal needs to be sampled above the Nyquist rate, i.e. the sampling frequency $F_s = 1/T_s > 2B$. The signal can be approximated within a period of T from $N \geq 2BT$ discrete samples as $$x(t) = \sum_{n=1}^{N} x(nT_s) \mathrm{sinc} B(t - nT_s).$$

The number N is called the Shannon number.

Given a complete basis $\Psi$ of $\Omega$, the signal can be represented as $$x(t) = \sum_{n} \theta_n \psi_n(t), \quad \psi_n \in \Psi.$$

$x(t)$ is said to be sparse in the domain defined by $\Psi$ if its coefficients satisfy $|\theta|_{(1)} \geq |\theta|_{(2)} \geq |\theta|_{(3)} \geq \ldots$ and $|\theta|_{(n)} \geq R \, n^{-1/p}$ for a constant R. For a given tolerance $\delta$, the signal can be approximated with $$\hat{x}(t) = \sum_{n=1}^{K} \theta_{(n)} \psi_n(t)$$

such that $\|x(t) - \hat{x}(t)\|_2 \geq \delta$. To find these K coefficients, samples are taken from the signal through a measurement matrix A as:

$$y = Ax + \epsilon = A\Psi\theta + \epsilon \tag{1}$$

According to the compressive sensing theory, if the signal is sparse enough, only $n = cK \log(N/K) < N/K) < N$ samples are needed to find the K coefficients with high probability, where c is a constant depending on the sparsity of the signal, as described in David L. Donoho, "Compressed Sensing", IEEE Trans. on Information Theory, Vol. 52, No. 4, pp. 1289-1306, April 2006, and E. Candes and T. Tao, "Decoding by linear programming", IEEE Trans. Information Theory, Vol. 51, 2005, pp 4203-4215.

The coefficients of the signal is recovered through an $l_1$-optimization approach as described in E. Candes and T. Tao, "Near Optimal Signal Recovery from Random Projections: University Encoding Strategies?", IEEE Trans. on Information Theory, Vol. 52, No. 12, pp. 5406-5425, December 2006.

$$\min_{\theta} \|\Psi\theta\|_{l_1} \text{ s.t. } y = A\Psi\theta \tag{2}$$

or some of its variations. To reach this goal, the matrix $A\Psi$ should satisfy the K-Restricted Isometry Property (RIP) as described in E. Candes and T. Tao, "Decoding by linear programming", IEEE Trans. Information Theory, Vol. 51, 2005, pp 4203-4215:

$$(1 - \delta_K) \|\theta_T\|_2^2 \leq \|(A\Psi)_T \theta_T\|_2^2 \leq (1 + \delta_K) \|\theta_T\|_2^2 \text{ for all } |T| \leq K \tag{3}$$

Given a matrix $A\Psi$, it is hard to verify whether $A\Psi$ satisfies RIP. However, many matrices with random entries have high probability of satisfying RIP. Hence, according to the present disclosure a way to ensure high probability of signal recovery from $n < N$ samples is to randomize the entries in the measurement matrix.

Referring to FIG. 1A, a first-order time encoding machine 10 is shown for encoding amplitude information into a time sequence in accordance with the prior art. A time encoding machine (TEM) is an asynchronous mechanism for encoding amplitude information into a time sequence. As shown in FIG. 1A the input 12 is amplified by amplifier 14 and integrated by integrator 18. A hysteresis quantizer 20, which may be a relay or a comparator, detects the zero crossings to form the output 22, which is then fed back via amplifier 26 to summer 16, which provides feedback to the integrator 18.

Figure 1B:
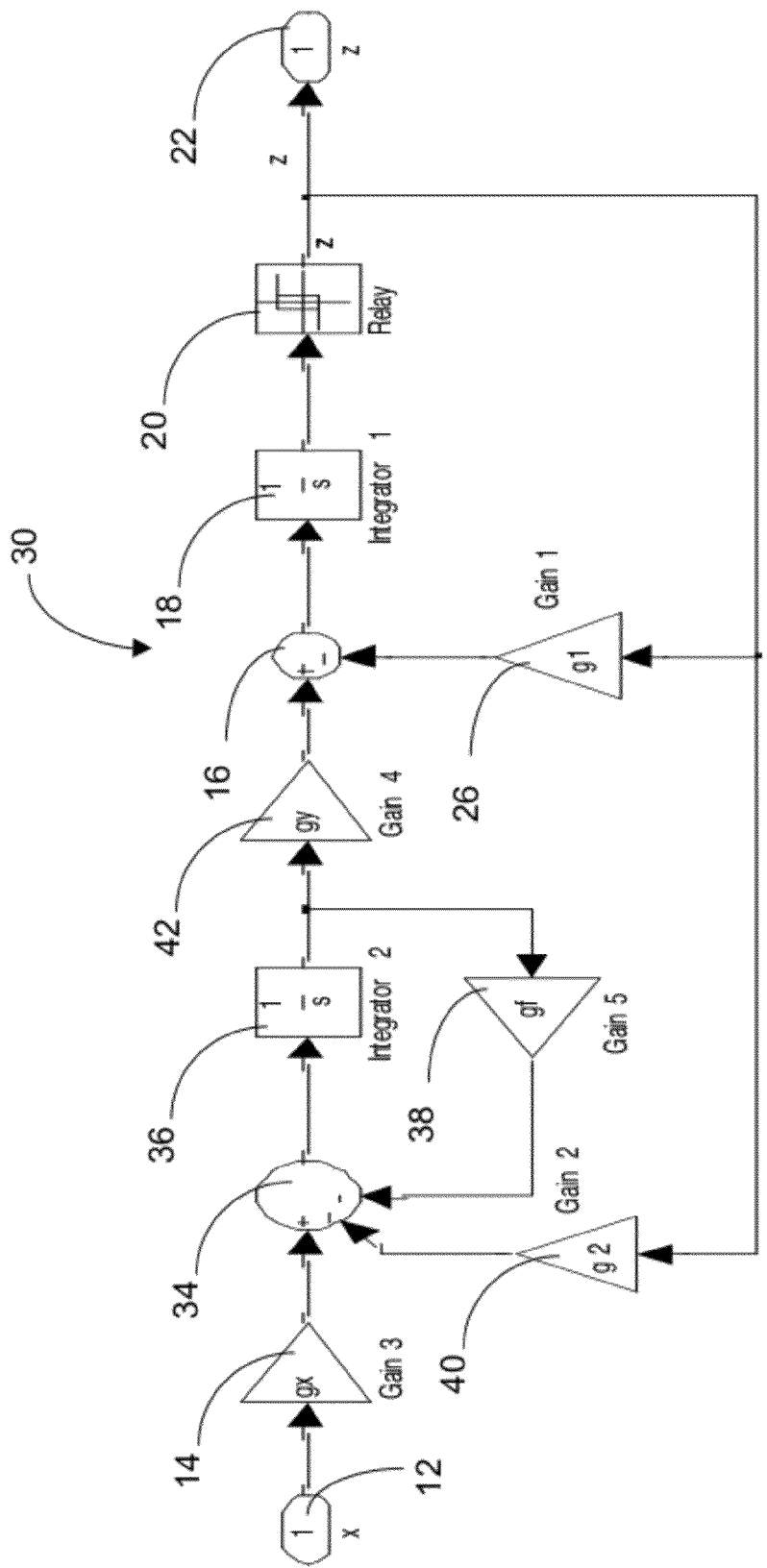
FIG. 1B shows a second-order time encoding machine for encoding amplitude information into a time sequence in accordance with the prior art.

Filters for shaping the signal can be added in the front of the TEM to form a second-order time encoding machine (TEM) 30 for encoding amplitude information into a time sequence in accordance with the prior art, as shown in FIG. 1B. The filter for shaping includes summer 34, integrator 36, feedback amplifiers 38 and 40, and amplifier 42.

Let $\{t_k\}$ be the encoded time sequence. The interval between time points $T_k = t_{k+1} - t_k$ is measured. For a first order TEM, the relationship between the signal and the time sequence satisfies the following equation as described in Aurel A. Lazar and László T. Tóth, "Perfect Recovery and Sensitivity Analysis of Time Encoded Bandlimited Signals", IEEE Trans. on Circuits and Systems-I: Regular Papers, Vol. 51, No. 10, October 2004, pp. 2060-2073:

$$\int_{t_k}^{t_{k+1}} g_1 x(u) du = (-1)^k [2\delta - g_1 b(t_{k+1} - t_k)] \tag{4}$$

When the signal is represented by a basis $\Phi$ of $$\Omega \text{ as } x(t) = \sum_l a_l \varphi_l(t), \quad \varphi_l \in \Phi,$$

Eq. (3) then becomes $$\int_{t_k}^{t_{k+1}} g_x \sum_l a_n \varphi_l(u) \, du = (-1)^k [2\delta - g_1 b(t_{k+1} - t_k)] \quad (5)$$

Comparing (1) and (5), results in the following correspondence:

$$[A\Psi]_{k,l} = \int_{t_k}^{t_{k+1}} \phi_1(u) du, \theta_1 = a_1, y_k = (-1)^k [2\delta - g_1 b(t_{k+1} - t_k)] \quad (6)$$

Figure 2A:
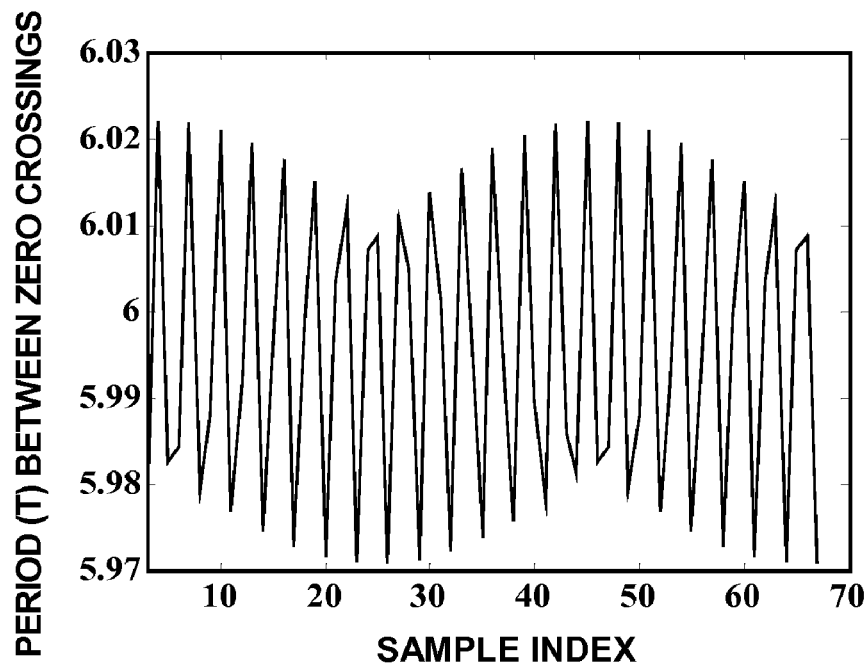
FIG. 2A shows an encoding result of a single tone for a time encoding machine in accordance with the prior art.
Figure 2B:
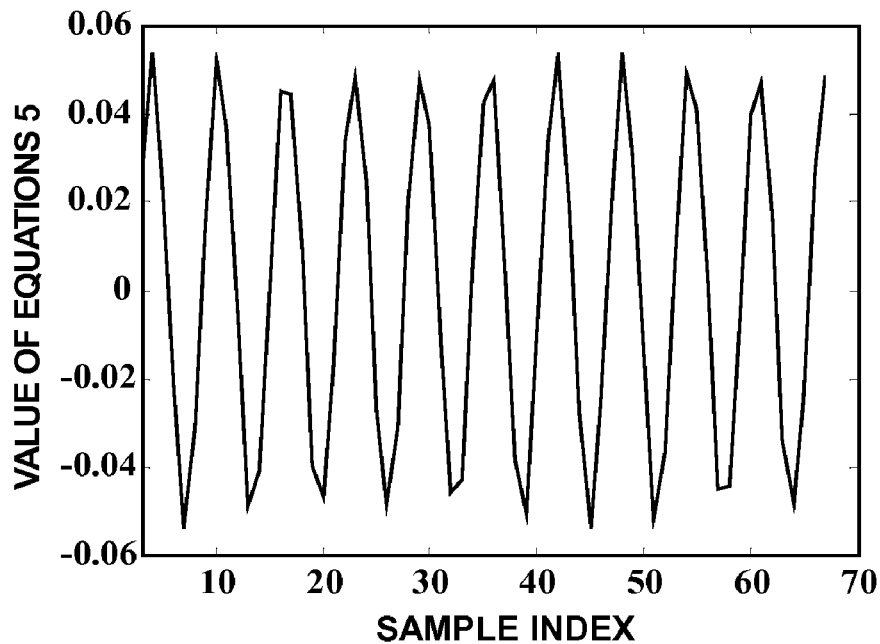
FIG. 2B shows the value of equation 5 for a time encoding machine in accordance with the prior art.

Since the time points $t_k$ are carrying the information of the input signal, the entries of the measurement matrix $[A\Psi]_{k,l}$ are highly signal dependent and generally not random. FIGS. 2A and 2B show an encoding result $\{T_k\}$ of a single tone $x(t)=0.3 \sin(wt)$ for a time encoding machine in accordance with the prior art, and the value of the measurement matrix of equation (5) for a time encoding machine in accordance with the prior art, respectively.

Although the above analysis is for a first order time encoder, a similar analysis and result occurs for a second order time encoder.

The regularity in the measurement matrix, as shown in FIG. 2B obviously contradicts the randomization rule in compressive sensing. With such a measurement matrix, the probability of unsuccessful reconstruction is high. For example, for the single tone above, if the only available information is that the bandwidth of the signal $|B|<0.5$, to reconstruct the signal within the time period [0,400] seconds, K=1, N=400. With 10 measurements, 12 out of 100 signals could not be reconstructed correctly. Once the signal sparsity reduces, the failure probability rapidly increases. Hence, a better procedure to take measurements is needed to improve the success probability. Ten (10) measurements are enough for the conventional compressive sensing, which takes random samples from the signal, to accurately reconstruct the signal.

Equation (6) shows that the measurement matrix entries only depend on the and the time sequence. Since the are typically fixed, the only component that can be randomized is the time sequence. One approach according to the present disclosure is to randomize the input to the hysteresis quantizer of the TEM, which is equivalent to randomizing the switching point of the hysteresis quantizer, leading to a random time sequence. However, since the switching point depends both on the input signal and the added random signal, the information of the signal is still encoded in the time sequence. Hence, if the random signal is known, the input signal can be fully recovered from the time sequence.

Besides the regularity of the measurements, there is another problem associated with the prior art TEMs. The prior art TEMs attenuate high frequency signals more than low frequency signals. When a signal is sparse in the frequency domain, the $l_1$-optimiation in equation (2) favors low frequency components because they make more of a contribution to the measurements. This tendency leads to errors in signal reconstruction. According to the present disclosure this problem is addressed by a two-step reconstruction approach.

According to equation (4), given a fixed switching point of the hysteresis quantizer $\delta$ and fixed amplifier gains, the time sequence generated by the TEM totally depends on the signal.

Since it is hard to randomize the switching point and the amplifier gains directly, the easiest way to randomize the time sequence would be adding a random signal. Potentially there are two places to add this random signal: in front of the hysteresis quantizer 72, as shown in the time encoding machine 50 in FIG. 3A, or in front of the integrator 18, as shown in the time encoding machine 80 in FIG. 3B.

Figure 3A:
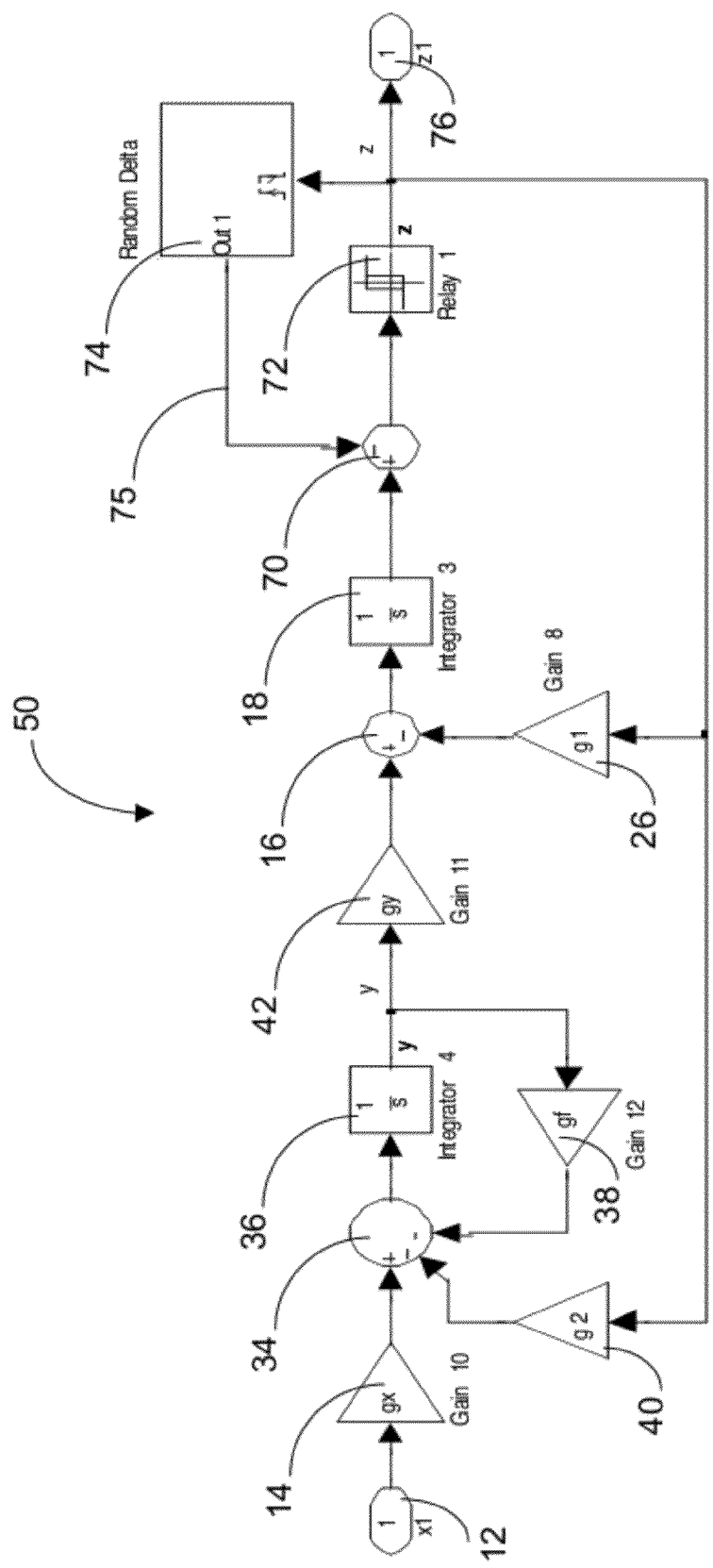
FIG. 3A shows a time encoding machine for encoding amplitude information into a time sequence in accordance with the present disclosure.
Figure 3B:
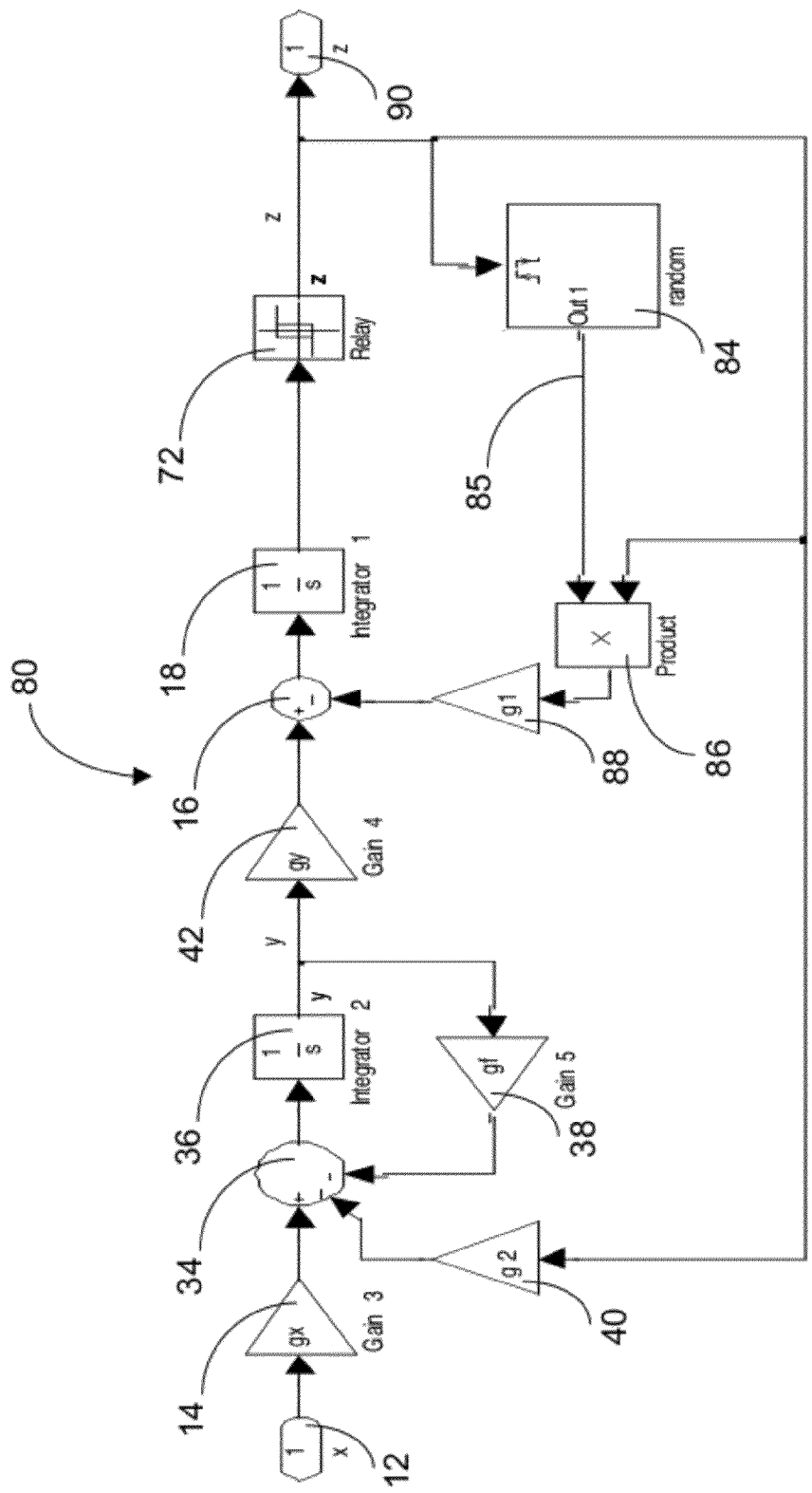
FIG. 3B shows another time encoding machine for encoding amplitude information into a time sequence in accordance with the present disclosure.

If the random signal is added in front of the integrator 18, as shown in FIG. 3B, the entire random signal needs to be accurately known for it to be removed later in the signal recovery process. This may impose a tight requirement on the accuracy of the circuit. However, by using the random signal 85 to control the gain of the amplifier $g_1$ 88, as shown in FIG. 3B, the operation is similar to Automatic Gain Control (AGC), which is used in many radio frequency (RF) circuits and the technique is mature.

On the other hand, if the signal is added after the integrator 18, as shown in FIG. 3A, only the signal values at the hysteresis quantizer 72 switching times need to be known. After the hysteresis quantizer 72 switches, the random signal 75 reaches a new voltage level. At the next point when the hysteresis quantizer 72 switches, the integrator 18 of the input signal would be at a different voltage level. From the input signal point of view, it is connected with a hysteresis quantizer with a random switching voltage.

The two different implementations are in FIG. 3A and FIG. 3B. The pseudorandom signals 75 and 85 are generated from the random delta block 74 and 84, as shown in FIGS. 3A and 3B, respectively. The random delta blocks 74 and 84 may be a pseudorandom sequence generator, and include a pseudorandom number generator.

The TEM 50 shown in FIG. 3A is similar to the second-order time encoding machine of FIG. 1B; however, random delta block 74, and summer 70 are now included. The summer 70 is connected between integrator 18 and hysteresis quantizer 72. The summer may either add or subtract the random signal 75 from random delta block 74 to/from the output of integrator 18. The result is connected to the input of hysteresis quantizer 72, as shown in FIG. 3A. The random delta block 74 is clocked by the output 76 time sequence from the TEM.

The TEM 80 shown in FIG. 3B is also similar to the second-order time encoding machine of FIG. 1B; however, random delta block 84 and mixer 86, which controls the gain of amplifier 88, are now included. The random delta block 84 is clocked by the output 90 time sequence from the TEM. The random signal 85 from random delta block 84 is connected to the mixer 86, which mixes or multiplies the random signal 85 from random delta block 84 with the output 90 time sequence from the TEM. The output of mixer 86 feeds amplifier 88, which is an input to summer 16. In another embodiment, there is no mixer 86 and instead the random signal 85 from random delta block 84 may be connected directly to amplifier 88 or connected directly to summer 16.

Figure 3C:
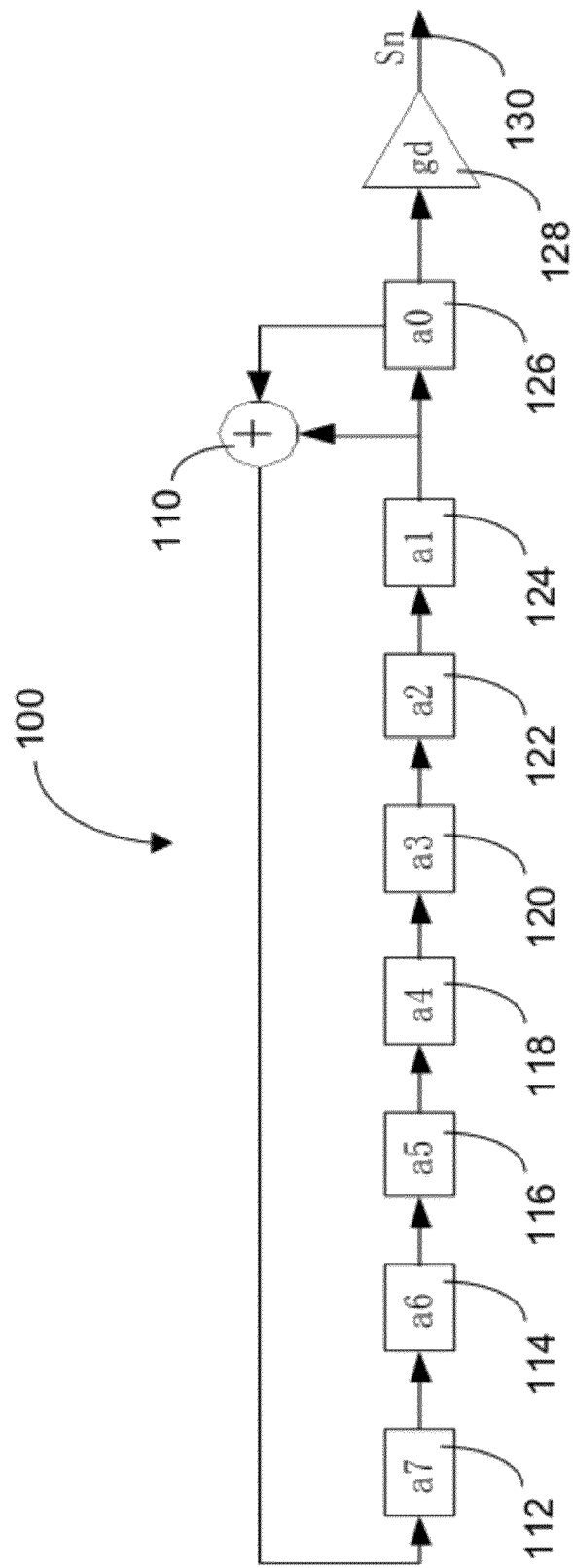
FIG. 3C shows an example random delta block for a time encoding machine for encoding amplitude information in accordance with the present disclosure.

Any random signal should be able to help improve the system performance. More voltage level and larger voltage range of the random signal often provides more improvement. However, complex random signals also lead to complex circuits. Through simulation, it has been found that a one-bit random sequence generator generates better results than an TEM without randomization. A simple random sequence generator 100, such as an m-sequence generator, as shown in FIG. 3C, can fulfill the function of the random delta blocks and 84 in FIGS. 3A and 3B, respectively. The random sequence generator 100 in FIG. 3C has one bit registers 112, 114, 116, 118, 120, 122, 124 and 126, summer 110, and amplifier 128 with an output 130. The only requirement for initialization is that at least one of the one bit registers be nonzero. As discussed above, the output time sequence 76 or 90 from TEM 50 or 80, respectively serves as the clock signal to the random sequence generator 100. Thus, the random signal generator 100 also operates asynchronously. Although, the above describes an m-sequence generator, any other type of random sequence generator known in the art may be used.

Figure 4:
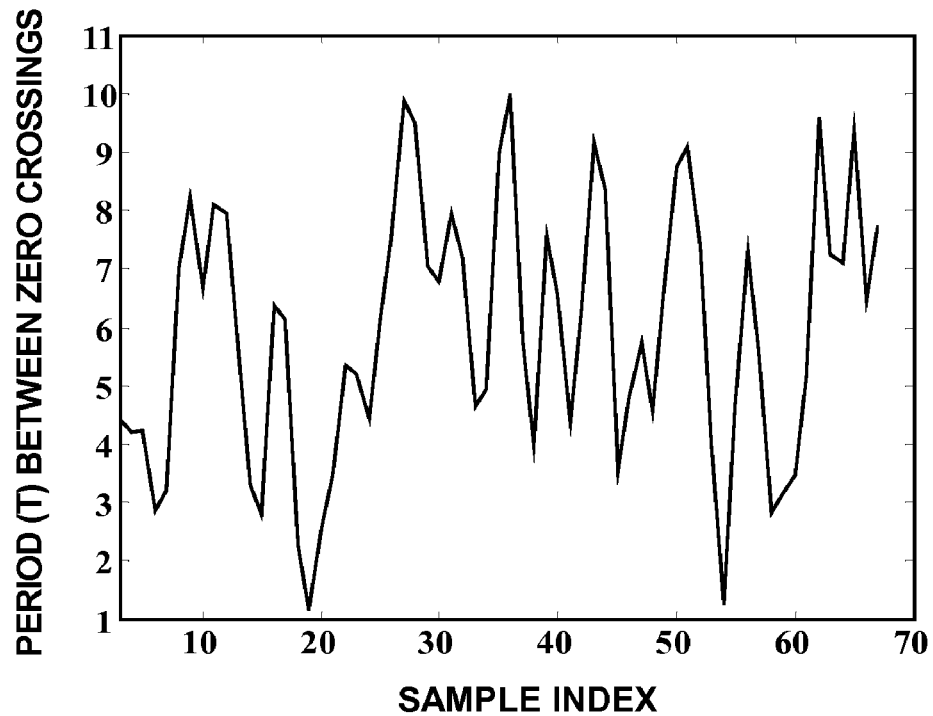
FIG. 4 shows an encoding result of a single tone for a time encoding machine in accordance with the present disclosure.

The encoded time sequence $\{T_k\}$ from the output 76 for the randomized TEM 50 of FIG. 3A is shown in FIG. 4 for the same single tone as for the encoded time sequence from 22 shown in FIG. 2A for the nonrandomized TEM 30 of FIG. 1B. Comparing the plot in FIG. 4 to the plot of FIG. 2A, it is evident that the encoded time sequence of FIG. 4 shows much more random behavior.

Because of the integrator 18 in a TEM, the frequency response of a TEM exhibits the behavior of a lowpass filter. This behavior is directly reflected in the measurement matrix. For example, suppose the signal is expanded into Fourier series of N frequencies as $$x(t) = a_0 + \sum_{l=1}^{N} a_{1l}\cos(lwt) + \sum_{l=1}^{N} a_{2l}\sin(lwt).$$

The corresponding measurement matrix for the TEM in FIG. 3A is:

$$[A\Psi]_{k,l} = \frac{1}{lw}(\sin(lwt_{k+1}) - \sin(lwt_k)), \quad (7)$$

$$[A\Psi]_{k,2l} = \frac{1}{lw}(\cos(lwt_k) - \cos(lwt_{k+1}))$$

Obviously, higher frequency terms (corresponding to larger l) have larger attenuation. In the second order TEM, this problem is somewhat alleviated because of the leaky integrator. Increasing the leaky factor $g_f$ can reduce the imbalance in the column norm of the measurement matrix. However, a large leaky factor also results in a smaller signal after the leaky integrator. Hence, the effectiveness of the leaky integrator in balancing the column norm of the measurement matrix is very limited.

Figure 5:
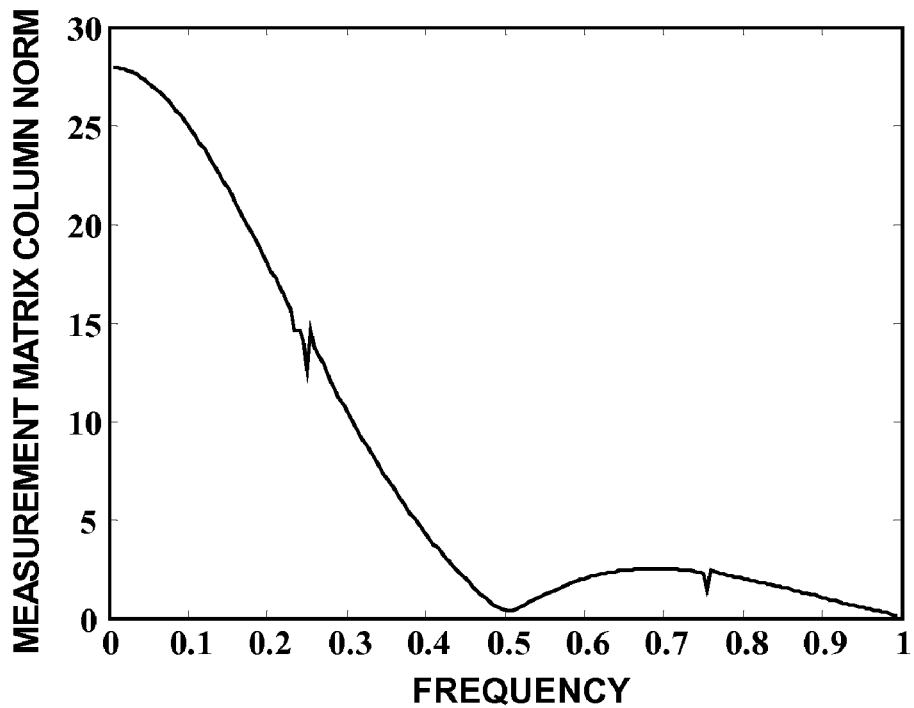
FIG. 5 shows the column norm of a measurement matrix for a second order time encoding machine using an N frequency Fourier series as the signal basis in accordance with the present disclosure.

The column norm of a measurement matrix for example for the second order TEM of FIG. 3A using an N frequency Fourier series as signal basis is presented in FIG. 5. In the plot, only the part of matrix for the cosine basis is shown; however, the part for the sine basis is similar. The attenuation at high frequencies can be clearly seen in the plot of FIG. 5. With such a matrix, the high frequency coefficients make a smaller contribution to the measurements than the low frequency coefficients with similar value. Thus in the compressive sensing algorithm, the high frequency coefficients are more likely to be the trimmed than the low frequency ones, resulting in reconstruction errors. To solve the unbalanced measurement matrix problem, according to the present disclosure, the coefficients are not directly reconstructed from the compressive sensing algorithm. Instead, a diagonal matrix S is introduced to balance the measurement matrix. The matrix S is constructed as the inverse of the column norm of the original measurement matrix, i.e. $[S]=1/\sqrt{[(A\Psi)^T(A\Psi)]_{l,l}}$. Eq. (1) becomes $$y = A\Psi SS^{-1}\theta + \epsilon \quad (8)$$

Using $A\Psi S$ as the new measurement matrix, $x_1 = S^{-1}x$ is reconstructed from the compressive sensing algorithm. Since S is a known diagonal matrix, the signal itself can be easily recovered as $x = Sx_1$.

The effectiveness of randomizing the hysteresis quantizer switching point and using a two-step reconstruction method, have been proven through simulation. In a first test a single tone of various frequencies was reconstructed using 10 measurements. The signal is sparse in frequency domain with K=1 and N=400. The measurement is assumed to be accurate without any noise in it. The output SNR is plotted in FIG. 6 for two different cases: with randomization 150 and without randomization 152. The random signal is added after the integrator 18, as shown for the TEM 50 in FIG. 3A and the random signal 75 is generated with the one bit random sequence generator 100 shown in FIG. 3C. For both with randomization of the hysteresis switching and without randomization of the hysteresis switching, the two step reconstruction process described above was used, because without the two step reconstruction process, the signal cannot be recovered at all with so few measurements. A reconstruction failure was deemed to occur when the output SNR fell to less than 80 dB. The result was that 12 out of 99 signals were deemed failed to be reconstructed without randomization of the hysteresis switching. With randomization, all 99 signals were deemed to be reconstructed with output SNR better than 80 dB.

With a randomized TEM 50 or 80 as shown in FIGS. 3A and 3B, the number of measurements can be further pushed down to 8. This result is also better than the conventional compressive sensing using a conventional ADC, which as discussed above are not adequate for direct digitization of wide bandwidth and high dynamic range RF signals. However, in the test with conventional compressive sensing, the minimum number of measurements needed to accurately reconstruct all signals was 10. With only 6 measurements, 7 signals had large reconstruction errors.

To prove that randomization is useful for more complex signals where the time sequence is less regular, a test signal consisting of 10 tones was used. The results are shown in FIG. 7 for two different cases: with randomization of the hysteresis quantizer 154 and without randomization of the hysteresis quantizer 156. Let the entire bandwidth be B. The test signal is $$x = a\sum_{l=1}^{10} \sin\left(\frac{B}{100}(m+l)t + \theta_l\right), \quad m = 0, \ldots, 89, \quad \theta_l = 0, \frac{\pi}{2}.$$

The only known information is value of B. The reconstruction bases are sin $$\left(\frac{kB}{200}t\right)$$

and cos $$\left(\frac{kB}{200}t\right),$$

k=0, . . . , 199. Hence, the signal is sparse in the frequency domain with K=10 and N=400. In the 90 tests where m changes from 0 to 89, 140 measurements are taken. Again from FIG. 7, it can be seen that randomization helps reach a higher successful reconstruction rate. Higher degrees of randomization, such as using a signal with a uniform distribution within a range to randomize the time points, can reach accurate reconstruction for all signals with only around 100 measurements. This number is comparable to conventional compressive sensing, which requires at least 87 to reconstruct all signals accurately.

One potential problem with the two step reconstruction process is that it may boost noise at high frequencies. To check whether this is the case, the single tone test described above with respect to FIG. 6 was repeated, but this time with measurement noise added. In the test 138 measurements were taken and the result is plotted in FIGS. 8A and 8B, for 60 dB input SNR and 20 dB input SNR, respectively. Although the results do exhibit deterioration at high frequency, the deterioration is less severe when the two-step procedure 160 is used compared to the result when the signal is reconstructed directly from the measurements, a so-called one step procedure 162 as in equation (2). It has been found that with the two-step procedure, a higher output SNR than the input SNR can be reached with fewer measurements. In the test 138 measurements were taken only to enable the one-step procedure to be able to recover some signals in relatively high frequency to make reasonable comparison.

From the simulations, a person skilled in the art would conclude that the present disclosure improves the performance of time-encoding-based compressive sensing. The combination of randomizing the hysteresis quantizer and the two-step reconstruction process greatly improves the ability to accurately reconstruct time-encoding-based compressive sensed signals and make the performance of TE-CS systems comparable to that of conventional CS systems with ideal sampling process. In addition, the added randomizing circuit is compatible with APP technology since it runs in a digital and asynchronous mode. Hence, it will not detract from any of the advantages of APP technology.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A time encoding machine (TEM) for time encoding an input signal, the time encoding machine comprising:
    a hysteresis quantizer having a time encoded sequence output; and
    a random sequence generator having a random signal output coupled to the hysteresis quantizer for randomizing switching times of the hysteresis quantizer.

2. The TEM of claim 1 wherein the random sequence generator is clocked by the time encoded sequence output.

3. The TEM of claim 1 wherein the random sequence generator is a pseudorandom sequence generator.

4. The TEM of claim 1 wherein the random sequence generator is a one bit pseudorandom sequence generator.

5. The TEM of claim 1 wherein the hysteresis quantizer comprises a relay or a comparator.

6. The TEM of claim 1 wherein the time encoding machine comprises a second order time encoding machine.

7. The TEM of claim 1 wherein the time encoded sequence output rate is lower than a Nyquist rate for the input signal.

8. The TEM of claim 1 wherein the hysteresis quantizer detects zero crossing time points to form the time encoded sequence output.

9. The TEM of claim 1 wherein the time encoding machine (TEM) comprises time encoded compressive sensing of the input signal.

10. The TEM of claim 1 further comprising:
    an integrator having an integrator output, and
    a summer coupled to the random signal and the integrator output for summing the random signal and the integrator, the summer having a summer output coupled to the hysteresis quantizer;
    wherein switching times of the hysteresis quantizer are randomized.

11. The TEM of claim 10 wherein the summing comprises adding or subtracting the random signal to or from the integrator output, respectively.

12. The TEM of claim 1 further comprising:
    an integrator having an integrator output coupled to the hysteresis quantizer; and
    a summer coupled to the input signal and to the random signal and having a summer output coupled to the integrator;
    wherein switching times of the hysteresis quantizer are randomized.

13. The TEM of claim 12 further comprising:
    a mixer coupled to the random signal and the time encoded sequence output, the mixer having a mixer output coupled to the summer.

14. A method for forming a reconstructed signal of an input signal, the method comprising:
    forming a diagonal matrix S as an inverse of a column norm of a first measurement matrix $A\Psi$, so that $$[S]_{i,i} = 1/\sqrt{[(A\Psi)^T(A\Psi)]_{i,i}};$$

forming a second measurement matrix $A\Psi S$;
using the second measurement matrix to form $x_1 = S^{-1}x$; and
forming the reconstructed signal $x$ from $x_1$ and the diagonal matrix so that $x = Sx_1$.

15. A method for time encoded compressive sensing comprising:
- randomizing a switching point of a quantizer for time encoding an input signal to form a randomized time encoded sequence output; and
- using a two-step process to reconstruct the input signal from the time encoded sequence output.

16. The method of claim 15 wherein using a two-step process to reconstruct the input signal from the time encoded sequence output comprises:
- forming a diagonal matrix S as an inverse of a column norm of a first measurement matrix $A\Psi$, so that $$[S]_{i,i} = 1/\sqrt{[(A\Psi)^T(A\Psi)]_{i,i}};$$

- forming a second measurement matrix $A\Psi S$;
- using the second measurement matrix to form $x_1 = S^{-1}x$; and
- forming the reconstructed signal x from $x_1$ and the diagonal matrix so that $x = Sx_1$.

17. The method of claim 15 wherein the quantizer detects zero crossing time points to form the time encoded sequence output.

18. The method of claim 15 wherein randomizing a switching point of a quantizer for time encoding an input signal to form a randomized time encoded sequence output comprises:
- adding a random signal to the input signal.

19. The method of claim 18 wherein the random signal is added to the input signal before integrating the input signal.

20. The method of claim 18 wherein the random signal is added to the input signal after integrating the input signal.

21. The method of claim 15 wherein randomizing a switching point of a quantizer for time encoding an input signal to form a randomized time encoded sequence output comprises:
- time encoding an input signal with a hysteresis quantizer; and
- providing a random signal input to the hysteresis quantizer for randomizing the switching times of the hysteresis quantizer.

22. The method of claim 21 wherein the random signal input is generated by a random sequence generator.

23. The method of claim 22 wherein the random sequence generator is a pseudorandom sequence generator.

24. The method of claim 22 wherein the random sequence generator is a one-bit pseudorandom sequence generator.

* * * * *